United States Patent [19]
Myers

[11] Patent Number: 4,653,101
[45] Date of Patent: Mar. 24, 1987

[54] AUDIO REVERBERATOR

[75] Inventor: Daniel C. Myers, St. Charles, Ill.
[73] Assignee: William Beith, Elgin, Ill.

[21] Appl. No.: 593,808
[22] Filed: Mar. 27, 1984
[51] Int. Cl.[4] .................... H03G 3/00
[52] U.S. Cl. .................... 381/64; 310/316; 333/188; 84/DIG. 26
[58] Field of Search .................... 381/67, 64, 65, 63, 381/98; 84/DIG. 26; 333/187, 188; 310/316, 324, 317, 318; 179/110 A

[56] References Cited

U.S. PATENT DOCUMENTS

| | | | |
|---|---|---|---|
| 3,047,823 | 7/1962 | Ranky | 333/188 |
| 3,189,686 | 6/1965 | Brombaugh | 381/65 |
| 3,328,609 | 6/1967 | Clicques | 310/317 |
| 3,409,787 | 11/1968 | Agalides et al. | |
| 3,624,431 | 11/1971 | Machida et al. | |
| 3,980,905 | 9/1976 | Miller | 310/317 |
| 4,223,242 | 9/1980 | Redlich et al. | |
| 4,481,663 | 11/1984 | Spranger | 179/110 A |

OTHER PUBLICATIONS

*Operating Instructions,* EMT 140, Gotham Audio Corporation, 2 West 46th Street, New York, NY 10036.
*Instruction Manual, EMT* 410, *Reverberator Unit,* Gotham Audio Corporation, 2 West 46th Street, New York, NY 10036.
D. Cronin, "Build a Plate Reverb," MIX, vol. 7, (No. 10), Oct. 1983, pp. 195–199.
*Piezoelectric Transducers Technical Manual,* 7.5 M/683/MS,EC–103, Kyocera International, Inc., San Diego, CA.
*Piezo Voice Transducer,* Kyocera International, Inc., San Diego, CA.
*Piezoelectric Transducers,* 10M/683/MS,EC–106, Kyocera International, Inc., San Diego, CA.

*Primary Examiner*—Forester W. Isen
*Attorney, Agent, or Firm*—Welsh & Katz, Ltd.

[57] ABSTRACT

An audio reverberator system having a piezoelectric transducer filter circuit for outputting selected audio vibrational frequencies having selected amplitudes responsive to inputs from an amplifier. The audio reverberator system includes a piezoelectric transducer having an intrinsic capacitance coupled to an additional circuit element to form a low-pass type filter circuit for attenuating higher frequency inputs to the transducer to provide a desired flat frequency response for an audio vibrational output to vibrate a reverberation plate for production of a desired audio output.

3 Claims, 4 Drawing Figures

AUDIO REVERBERATOR

The present invention relates generally to a piezoelectric filter circuit for outputting selected audio vibrational frequencies responsive to electrical inputs. More particularly, this invention relates to an audio reverberator system for generating selected audio frequencies and amplitudes by providing an amplifier output to a piezoelectric transducer which generates vibrations in an attached reverberator plate and which also has an intrinsic capacitance that functions as an element in the filter circuit for attenuating higher frequency components in a predetermined manner.

Reverberator devices have been tuilized to enhance audio effects, as well as create new audio effects, for use in various aspects of the entertainment industry. However, prior reverberator devices have been limited to units which utilize an audio speaker-voice coil to vibrate a reverberator plate to generate the desired reverberation effects.

Therefore, one of the objects of the invention is to provide a piezoelectric filter circuit for outputting selected audio vibrational frequencies.

A more particular object of the invention is to provide an audio reverberator system having a piezoelectric transducer which is used both as an audio transducer to vibrate a reverberator plate and also used as a capacitance element in a filter circuit for passing desired low audio frequencies and attenuating higher audio frequencies in a predetermined manner.

Another object of the invention is to provide an audio reverberator system which utilizes a parallel driver-amplifier system to send a signal over a relatively long distance to vibrate a reverberator plate with a transducer without extraneous noise pickup affecting reverberator system performance.

A further object of the invention is to provide a piezoelectric transducer having a half-circle, disc shape for generating a flat-response, audio vibrational output in a coupled reverberator plate.

In accordance with the present invention, a piezoelectric transducer is used in an audio reverberator system to output selected audio frequencies, typically in the range of human hearing which is approximately ten Hertz to 20 kiloHertz. High frequency components produced by an audio driver-amplifier system are attenuated in a predetermined manner by a filter circuit coupled to the driver-amplifier system. The filter circuit includes a predetermined intrinsic capacitance associated with the piezoelectric transducer and at least one additional circuit element, such as a resistor. The piezoelectric transducer is coupled to a reverberator plate which is vibrated by an audio vibrational output from the transducer. A pick-up transducer is also coupled to the plate and converts a sensed vibration into a characteristic electrical output which is amplified, and a desired reverberation output is provided via loudspeakers.

Further objects and advantages of the present invention, together with the organization and manner of operation thereof, will become apparent from the following detailed description of the invention when taken in conjunction with the accompanying drawings wherein like reference numerals designate like elements throughout the several views.

BRIEF DESCRIPTION OF THE DRAWINGS

FIG. 3 shows the frequency response curve of a reverberation plate with the transducer coupled thereto.

DETAILED DESCRIPTION

Figure 1:
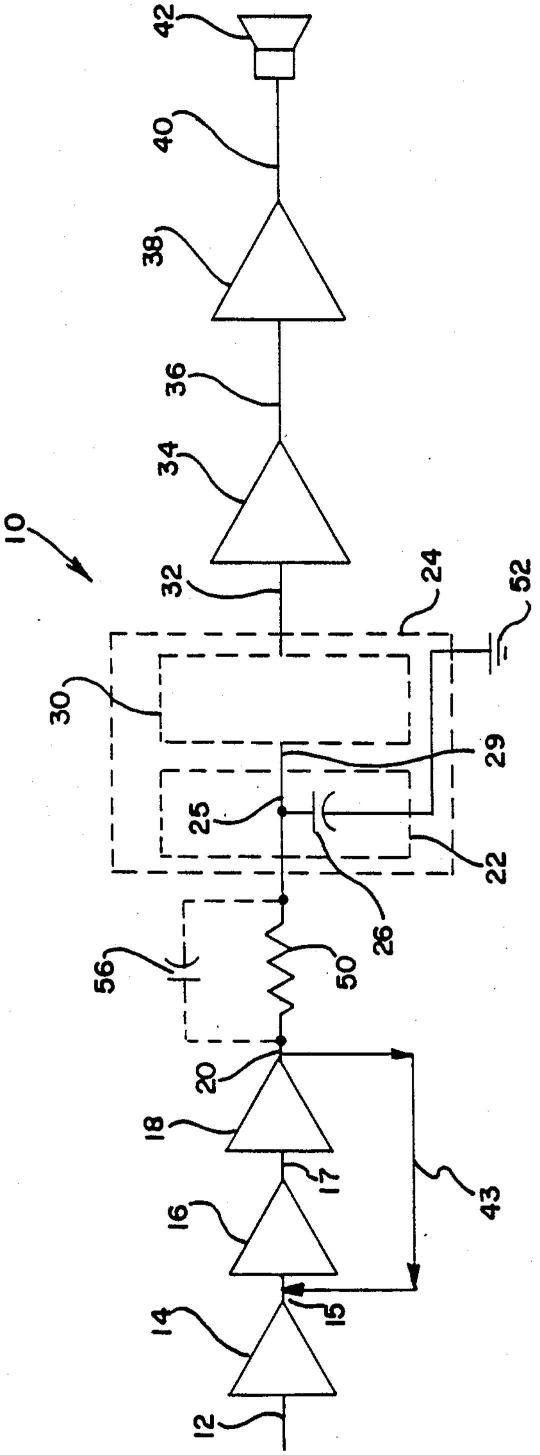
FIG. 1 is a functional block diagram of an audio reverberator system.
Figure 2:
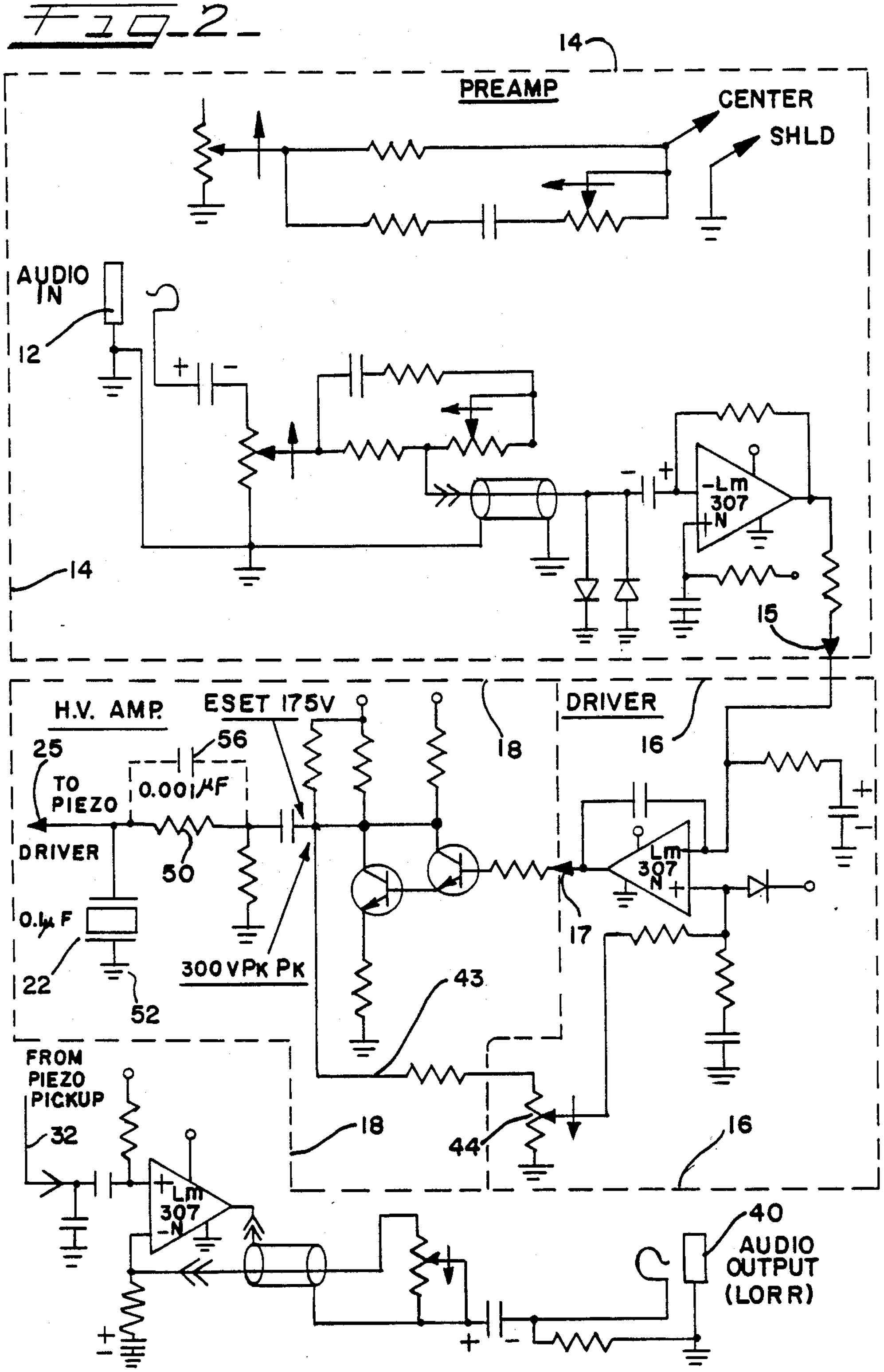
FIG. 2 is a circuit diagram showing components of the reverberator system including a preamplifier, a driver, a high voltage amplifier and a filter circuit which includes an intrinsic capacitance of a transducer.

Referring now to the drawings and in particular to FIGS. 1 and 2, an audio reverberator system constructed in accordance with one embodiment of the present invention is indicated generally at 10. Note that within the block diagram components of FIG. 1 are circuit elements which are shown in detail by FIG. 2. Very generally, the reverberator system 10 during operation includes a preamp input 12 to preamp means, such as a preamplifier 14. A preamp output 15 from the preamplifier 14 is provided to an audio driver 16 which in turn provides an audio driver output 17. This audio driver output 17 is then input to a high voltage amplifier 18 which provides an amplified output 20 to a piezoelectric transducer 22 coupled to a reverberator plate 24. Responsive to the amplified output 20 the transducer 22 provides an internal electronic signal 25 which is a filtered signal having selectively attenuated high frequencies.

The piezoelectric transducer 22 has an intrinsic capacitance 26 functional as one element of a filter circuit comprised of the capacitance 26 and an additional element. The filter circuit selectively attenuates electrical inputs, such as the amplified output 20, to provide the selected audio vibrational frequencies in the internal electronic signal 25. This internal electronic signal 25 is converted by the transducer into a piezo driver, or a vibrational, output 29 which generates vibrations or reverberations in the plate 24. A second piezoelectric transducer 30 coupled to the plate 24 senses the vibrations of the plate 24 and generates an electrical output 32 to a second preamplifier 34 which provides a second preamp output to an audio output means, such as an audio mixer 38. The audio mixer 38 enables an audio engineer to combine the second preamp output 36 with audio signals from various other selectable sources. The audio mixer 38 then outputs an audio signal 40 to a sound output means, such as a tape system (not shown) or to a loudspeaker 42, for generation or recordation of the desired sound spectrum.

Turning now to a more detailed description of the audio reverberator system 10, the preamp input 12 to the preamp 14 is typically about 0.1–1.0 volts peak-to-peak. The input signal 12 can arise from audio means, such as a microphone, a tape recorder, an electronic sound producing device or a sound pick-up apparatus. The preamplifier 14 shown in FIGS. 1 and 2 is constructed in a manner to provide an amplified output of about ten volts peak-to-peak to the audio driver 16. The electronic components of FIG. 2 are depicted in a conventional manner to illustrate the construction of the system 10 with the main system components shown as dotted boxes. The circuit components (other than well-known elements of resistors, capacitors and inductors) are labeled with manufacturers part numbers in a manner known to those of ordinary skill in the art.

The function of the audio driver 16 is to enable comparison of the preamp output 15 to the amplified output 20 provided by the high voltage amplifier 18. A feedback circuit connection 43 enables this comparison operation by the driver 16. In a preferred embodiment, the feedback circuit connection 43 also includes an adjustable resistor element 44 to ground which adjusts the voltage bias level so that the amplified output 20 is set to one half the supply voltage (350 volts, for example as shown in FIG. 2), so the voltage swing is a symmetrical ±175 volts. The comparison operation results in generation of an appropriate value for the audio driver output 17 provided to the high voltage amplifier 18, and insures the voltage level of the amplified output 20 is a multiple of the voltage output for the preamp output 15. Furthermore, this feedback comparison insures that the high voltage amplifier 18 provides a substantially distortion-free voltage output for the amplified output 20. In the illustrated embodiment the amplified output 20 from the high voltage amplifier 18 is one hundred seventy-five volts peak-to-peak, and this voltage level is determined by the ability of the transducer 22 to withstand the applied voltage and the need to deliver a sufficient vibrational amplitude to the plate 24. In the instant case the preferred transducer selected for these conditions is a one inch diameter, 10 mil thick barium-titanate-zirconate crystal manufactured by Kyocera, Ltd., Japan. (See Piezoelectric Transducers Technical Manual, EC-103, Kyocera Corp., Japan, 1982, which is incorporated by reference herein).

The amplified output 20 provided by the amplifier 18 to the transducer 22 has inherent high frequency noise components which produce undesirable audio vibrational outputs from the transducer 22 and in turn cause undesirable high frequency reverberations by the plate 24. Furthermore, the conductance of the transducer 22 changes with frequency such that at higher frequencies the conductance of the transducer 22 is larger, and therefore the transducer vibrational output efficiency increases at higher frequencies. Since the voltage level is constant as a function of frequency for the amplified output 20, there must be a provision for predetermined graduated attenuation of the higher frequencies in order to provide the selected amplitudes or desired flat response as a function of increasing frequency for the vibrations applied by the transducer 22 to the plate 24.

As mentioned hereinbefore, the piezoelectric transducer 22 has the intrinsic capacitance 26 which is used as part of the filter circuit to attenuate the high frequency components of the amplified output 20 in the desired manner to provide the flat vibrational response output. In addition to the intrinsic capacitance 26 the filter circuit includes at least one additional circuit element connected to the transducer 22. Typically, the additional circuit element is a resistor 50 having an adjustable resistance which is connected to the intrinsic capacitance 26 to form a low-pass type of filter. In the illustrated embodiment of FIG. 2 the intrinsic capacitance 26 is 0.1 μF, and the resistor 50 has a resistance of 27k.Ω and has a power rating of ½ watt. The intrinsic capacitance 26 is electrically coupled to the plate 24, and is connected to electrical ground 52 since the plate 24 is connected to the electrical ground 52 to avoid extraneous electrical noise pickup. Both the intrinsic capacitance 26 and the resistor 50 can of course be manipulated to provide the desired low-pass type filter characteristics, such as a frequency cutoff having a particular corner frequency. (See, for example, *Electronics For Scientists and Engineers*, R. Benedict, Prentiss Hall, 1967; which is incorporated by reference herein).

The additional element of the filter circuit can also include other electrical components to provide a particular audio frequency response. For example, the resistor 50 can be placed in the circuit as shown in FIG. 2, and an inductor element (not shown) can be placed in series with the capacitance 26 connected to the ground 52. This circuit then provides a band pass type filter which allows only a selected band of audio frequencies to be passed to the transducer 22 for the production of reverberations in a preselected frequency range.

In a preferred embodiment the filter circuit also includes other electrical components to enable adjustment of the performance characteristics of the filter circuit. For example, in the illustrated embodiment of FIGS. 1 and 2 a trimming capacitor 56 is shown as part of a dotted line connection in parallel with the resistor element 50. This trimming capacitor 56 enables optimization of the performance of the filter circuit to provide a substantially flat response for vibrational amplitudes as a function of frequencies from about 100 Hertz to twenty kiloHertz.

The transducer 22 used to generate the vibrational output 29 in the plate 24 should provide as a function of frequency a substantially smooth and flat output of vibrational amplitudes for the plate 24. It was determined the optimum audio vibrational output from the transducer 22 was obtained for a half-circle geometry for the transducer 22 which eliminated a bending mode characterized by a dishing in and out of the transducer 22. By forming two half-circle crystals from each full circle crystal, an asymmetric portion 58 (shown as a dashed line in FIG. 3) of a frequency response curve 59 was eliminated from the curve measured for the plate 24 as shown in FIG. 3. After removing the asymmetrical portion 58, a substantially flat output portion 60 remains. Furthermore, the number of transducers 22 necessary to accomplish vibration and pickup of the vibrational frequencies is reduced by one half, which reduces the materials cost by one-half.

In another form of the invention, the selected audio vibrational frequencies output from the transducer 22 can be directly input to audio output means which amplifies the signal and/or mixes the signal in an amplifier system (not shown) or in the audio mixer 38 before providing a sound output via the sound output means, such as the loudspeaker 42.

Figure 4:
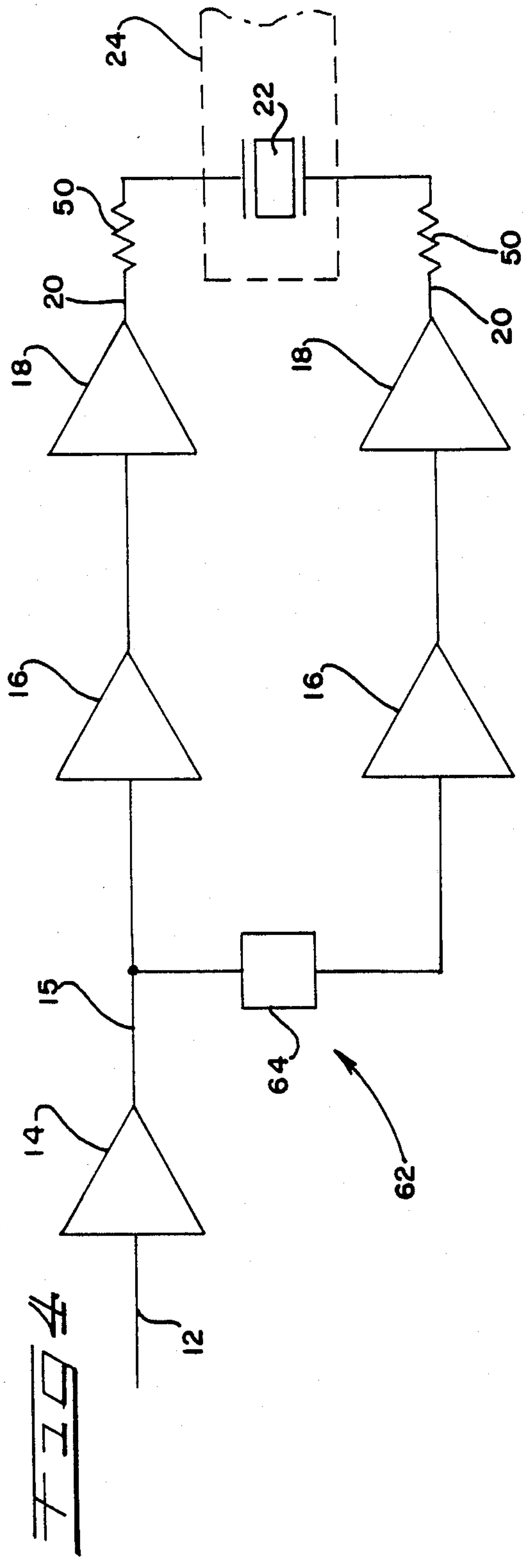
FIG. 4 is a functional block diagram of a differential, or parallel driver-amplifier, form of the audio reverberator system shown in the FIG. 1.
Figure 5:
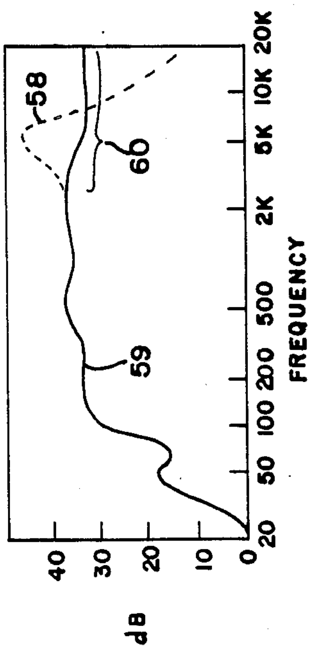

In another form of the invention the audio reverberator system 10 can be modified to a differential, or parallel driver-amplifier, system 62 as illustrated in the functional block diagram of FIG. 4. The differential system 62 includes an additional parallel one of the driver-amplifier means, such as the audio driver 16 and the high voltage amplifier 18, but the resistor 50 has a value half the value of the resistor 50 in the system 10 shown in FIGS. 1 and 2. This differential system 62 is utilized to send a signal over a relatively long distance to vibrate the reverberator plate 24 with the transducer 22, but avoiding extraneous noise pickup by the transmission lines which would affect the performance of the system 10. Such a system has applications in sound systems which require transmission of the preamp output 15 over relatively long distances to the audio driver 16 and to the high voltage amplifier 18. In such systems having surrounding electronic noise, this electrical noise can be introduced into the transmission lines, causing generation of undesirable audio components by the reverberator system 10. The use of the differential system 62 enables elimination of any net effect of the noise signals introduced therein. During operation of the differential system 62, the preamp output 15 is sent through both parallel sets of the driver 16 and amplifiers 18 with a phase inverter 64 interposed before the additional parallel set of the driver 16 and the amplifier 18. The phase inverter 64 changes the phase of the preamp output 15 by 180°. Any extraneous electronic noise signals introduced into each parallel line of the differential system 62 are therefore in phase. The transducer 22 has the amplifier outputs 20 applied to its opposite poles and only responds to amplifier outputs 20 from the parallel lines of the differential system 62 which have opposite polarity, that is, those signals out of phase 180° with one another. Since any of the extraneous noise signals introduced into the parallel lines of the differential system 62 are in phase, and thus have the same polarity, the transducer 22 does not respond and any extraneous noise pickup is effectively cancelled. In such a configuration the amplifier outputs 20 are applied to the transducer 22 through transducer electrical contacts which are electrically insulated from the plate 24 which is at ground potential. The transducer 22 is still, however, acoustically coupled to the plate 24 to allow transmission of audio vibrations to the plate 24.

The subject invention therefore has important advantages over the prior art in accomplishing audio reverberation effects in vibrating plates. The use of the piezoelectric transducer 22 to vibrate the plate 24 simplifies the installation and reduces the cost of the audio reverberator system 10. Furthermore, the piezoelectric transducer 22 has associated therewith the intrinsic capacitance 26 which enables its use as a component in the filter circuit to selectively attenuate higher audio frequencies to provide a flat output of vibrational amplitudes in the plate 24 as a function of frequency. Consequently, the piezoelectric transducer 22 functions not only to generate vibrations in the plate 24 but also acts as an electrical component in the filter circuit for generation of the desired vibrational output 29 for the reverberator system 10.

While preferred embodiments of the present invention have been illustrated and described, it will be understood that changes and modifications may be made therein without departing from the invention in its broader aspects. Various aspects of the invention are defined in the following claims.

What is claimed is:

1. An audio reverberator system for outputting selected audio frequencies comprising:
   - audio means for generating a preamp input;
   - preamp means responsive to said preamp input for amplifying said preamp input to provide a preamp output;
   - first driver-amplifier means responsive to said preamp output for providing an amplified output;
   - a phase inverter connected on an input side to said preamp output and on an output side to second driver-amplifier means, each of said driver-amplifier means being connected in series to opposite poles of a piezoelectric transducer via resistor elements having equal resistances;

- said piezoelectric transducer providing a vibrational output;
   - a filter circuit for attenuating selected audio frequencies coupled to said driver-amplifier means, said filter circuit including an intrinsic capacitance associated with said piezoelectric transducer and said resistor elements;
   - plate means having said transducer mounted thereon for undergoing vibration responsive to said vibrational output from said transducer;
   - pick-up means responsive to the vibration of said plate means for providing an electrical output characteristic of the vibrations; and
   - audio output means connected to be responsive to said electrical output for generating audio frequencies characteristic of the vibration of said plate.

2. An audio reverberator system for outputting selected audio frequencies comprising;
   - audio means for generating a preamp input;
   - preamp means responsive to said preamp input for amplifying said preamp input to provide a preamp output;
   - first driver-amplifier means responsive to said preamp output for providing an amplified output;
   - a phase inverter connected on an input side to said preamp output and on an output side to second said driver-amplifier means, each of said driver-amplifier means being connected in series to opposite poles of a piezoelectric transducer via resistor elements having equal resistances;
   - said piezoelectric transducer providing a vibrational output, said piezoelectric transducer comprising a substantially half-circle disc transducer;
   - a filter circuit for attenuating selected audio frequencies coupled to said driver-amplifier means, said filter circuit including an intrinsic capacitance associated with said piezoelectric transducer and said resistor elements;
   - plate means having said transducer mounted thereon for undergoing vibration responsive to said vibrational output from said transducer;
   - pick-up means responsive to the vibration of said plate means for providing an electrical output characteristic of the vibrations; and
   - audio output means connected to be responsive to said electrical output for generating audio frequencies characteristic of the vibration of said plate.

3. An audio reverberator system for outputting selected audio frequencies comprising:
   - audio means for generating a preamp input;
   - preamp means responsive to said preamp input for amplifying said preamp input to provide a preamp output;
   - first driver-amplifier means responsive to said preamp output for providing an amplified output;
   - a phase inverter connected on an input side to said preamp output and on an output side to second driver-amplifier means, each of said driver-amplifier means being connected in series to opposite poles of a piezoelectric transducer via resistor elements having equal resistances;
   - said piezoelectric transducer providing a vibrational output;
   - a filter circuit for attenuating selected audio frequencies coupled to said driver-amplifier means, said filter circuit including an intrinsic capacitance associated with said piezoelectric transducer and said resistor elements;

plate means having said transducer mounted thereon for undergoing vibration responsive to said vibrational output from said transducer;

the amplified output from each of said driver-amplifier means being applied to the transducer through electrical contacts which are electrically insulated from the plate means;

pick-up means responsive to the vibration of said plate means for providing an electrical output characteristic of the vibrations; and audio output means connected to be responsive to said electrical output for generating audio frequencies characteristic of the vibration of said plate.

* * * * *